(12) United States Patent
Nakamura et al.

(10) Patent No.: US 7,419,702 B2
(45) Date of Patent: Sep. 2, 2008

(54) METHOD FOR PROCESSING A SUBSTRATE

(75) Inventors: Kazuhito Nakamura, Yamanashi (JP);
Cory Wajda, Hopewell Junction, NY (US); Enrico Mosca, Ossining, NY (US); Yumiko Kawano, Kofu (JP); Gert Leusink, Saltpoint, NY (US); Fenton R. McFeely, Ossining, NY (US); Sandra G. Malhotra, Beacon, NY (US)

(73) Assignees: Tokyo Electron Limited, Tokyo (JP); International Business Machines Corp., Armonk, NY (US)

( * ) Notice: Subject to any disclaimer, the term of this patent is extended or adjusted under 35 U.S.C. 154(b) by 704 days.

(21) Appl. No.: 10/814,768

(22) Filed: Mar. 31, 2004

(65) Prior Publication Data

US 2005/0221002 A1 Oct. 6, 2005

(51) Int. Cl.
*C23C 16/00* (2006.01)
*B05D 3/04* (2006.01)

(52) U.S. Cl. .................... 427/255.7; 427/250; 427/230; 427/255.11

(58) Field of Classification Search ............ 427/255.28, 427/250, 237, 255.11, 255.7
See application file for complete search history.

(56) References Cited

U.S. PATENT DOCUMENTS

| 4,248,943 | A | * | 2/1981 | Ludwig et al. ............. 429/104 |
| 4,894,257 | A | | 1/1990 | Smith et al. .................. 427/78 |
| 5,695,832 | A | | 12/1997 | Hirano et al. ............... 427/577 |
| 5,705,080 | A | * | 1/1998 | Leung et al. ................ 438/680 |
| 5,952,060 | A | * | 9/1999 | Ravi ........................... 427/577 |
| 6,197,628 | B1 | * | 3/2001 | Vaartstra et al. ............ 438/238 |
| 6,413,321 | B1 | * | 7/2002 | Kim et al. .................... 118/725 |
| 6,452,775 | B1 | * | 9/2002 | Nakajima .................... 361/234 |
| 6,610,568 | B2 | | 8/2003 | Marsh et al. ................ 438/250 |
| 6,869,876 | B2 | * | 3/2005 | Norman et al. ............. 438/680 |
| 2001/0037769 | A1 | * | 11/2001 | Fukuda et al. .............. 118/722 |
| 2002/0025627 | A1 | * | 2/2002 | Marsh et al. ................ 438/250 |
| 2002/0072211 | A1 | * | 6/2002 | Itatani et al. ................ 438/608 |
| 2003/0064225 | A1 | * | 4/2003 | Ohashi et al. ............... 428/408 |
| 2003/0129306 | A1 | | 7/2003 | Wade et al. ............ 427/255.28 |
| 2003/0165620 | A1 | | 9/2003 | Wakabayashi et al. .................. 427/255.391 |

FOREIGN PATENT DOCUMENTS

EP 0440384 A1 * 8/1991

OTHER PUBLICATIONS

Konyashin et al., *Thin Films Comparable with WC-Co Cemented Carbides as Underlayers for Hard and Superhard Coatings: The State of the Art*, Diamond and Related Materials vol. 5, Apr. 1996, 575-579.
European Patent Office, *International Search Report*, PCT/US2005/004905, Aug. 26, 2005, 4 pp.

* cited by examiner

*Primary Examiner*—Timothy Meeks
*Assistant Examiner*—David Turocy
(74) *Attorney, Agent, or Firm*—Wood, Herron & Evans, LLP

(57) ABSTRACT

A method for processing a substrate on a ceramic substrate heater in a process chamber. The method includes forming a protective coating on the ceramic substrate heater in the process chamber and processing a substrate on the coated substrate heater. The processing can include providing a substrate to be processed on the coated ceramic substrate heater, performing a process on the substrate by exposing the substrate to a process gas, and removing the processed substrate from the process chamber.

18 Claims, 12 Drawing Sheets

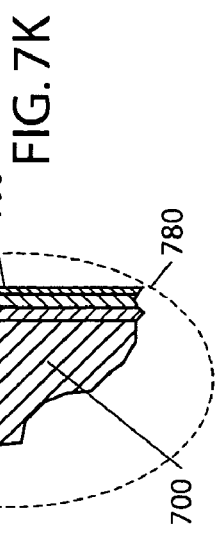
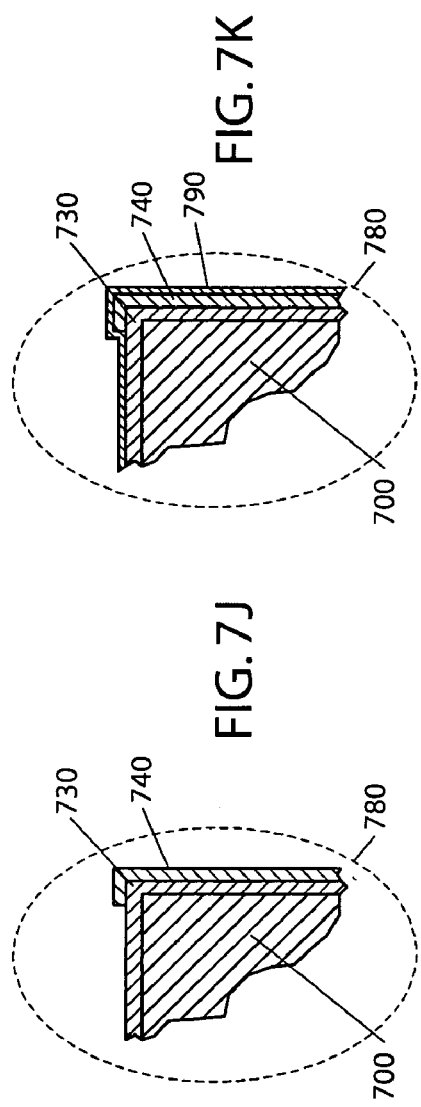
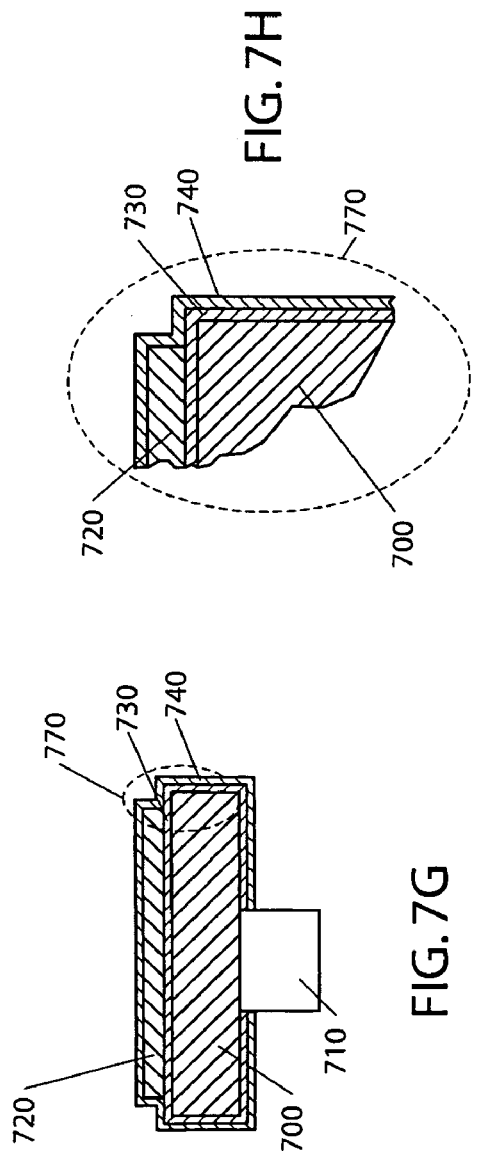

METHOD FOR PROCESSING A SUBSTRATE

FIELD OF THE INVENTION

The present invention relates to chamber processing, and more particularly to a method for processing a substrate in a process chamber having a ceramic substrate heater that supports the substrate.

BACKGROUND OF THE INVENTION

Many semiconductor fabrication processes are performed in process chambers such as plasma etch chambers, plasma deposition chambers, thermal processing chambers, chemical vapor deposition chambers, atomic layer deposition chambers, etc. These process chambers commonly use ceramic substrate heaters that support a substrate (e.g., a wafer) and provide heating of the substrate. In general, ceramic substrate heater materials provide good properties such as low thermal expansion, high temperature tolerance, a low dielectric constant, rigidity, and dimensional stability that make them preferred materials for many semiconductor applications. Ceramic substrate heaters are commonly composed of powdered metal oxides or nitrides combined with glass or frit particles. The mix of these materials is varied to generate a range of physical properties. The mixture is shaped into its desired form either by tape casting, powder pressing, roll compacting, or extrusion, and then sintered to form a hard crystalline structure.

Common ceramic materials for use in ceramic substrate heaters include alumina ($Al_2O_3$), aluminum nitride (AlN), silicon carbide (SiC), and beryllium oxide (BeO). Alumina is the most widely used ceramic material due to good availability, relatively low cost and stable physical properties. It is easy to fabricate into a range of shapes while remaining strong at high temperatures and it is available in a variety of purity levels. Beryllium oxide has the highest thermal conductivity available and has excellent dielectric strength needed for some applications, but it is available only in small sizes and safety can be a concern when dealing with toxic beryllium oxide powder. Silicon carbide is also highly conductive and offers an alternate to aluminum nitride and beryllium oxide, but caution must be used when selecting silicon carbide materials as dielectric strength can vary as temperature increases.

Aluminum nitride has high thermal conductivity that makes it an excellent choice where fast response or high levels of temperature uniformity are required, but it is costly to fabricate due to a high temperature firing requirement and material cost. Aluminum nitride substrate heaters are chemically "clean" substrates that meet the tough clean room environment for the semiconductor, medical and other very stringent applications. Furthermore, aluminum nitride substrate heaters used in semiconductor processing, can feature rapid heat up, easy temperature control, and excellent plasma durability.

Processing of substrates in a process chamber of a processing system can result in formation of material coatings on system components exposed to the process environment. For example, a coating can be formed on areas of a ceramic substrate heater that are not covered by a substrate. The partial coating of the ceramic substrate heater can lead to variations in the (thermal) emittance of the heater surfaces and can cause temperature non-uniformity and thermal stressing in the ceramic substrate heater. The thermal stressing can in time result in un-repairable mechanical damage such as cracking of the ceramic heater material. In addition, contacting a substrate with a substrate heater or a material coating on a substrate heater can result in backside contamination of a substrate. For example, copper diffusion in silicon devices is a well-known backside contamination problem, but other metals, for example ruthenium (Ru), can also be fast diffusers in silicon under moderate temperatures and bias conditions. The present inventors have recognized that improved methods are needed for reducing or preventing the above-mentioned problems associated with formation of material coatings on ceramic substrate heaters during substrate processing, while ensuring compliance with the strict requirements of processing semiconductor substrates.

SUMMARY OF THE INVENTION

The present invention provides a method for processing one or more substrates in a process chamber having a ceramic substrate heater, including forming a protective coating on the ceramic substrate heater and processing a substrate supported on the coated ceramic substrate heater. The processing can include providing a substrate to be processed on the coated ceramic substrate heater, performing a process on the substrate, and removing the processed substrate from the process chamber. The protective coating includes a surface portion that is either a non-metal layer or a combined metal/non-metal layer and that reduces or eliminates backside contamination to a substrate placed on the surface. In an exemplary embodiment, the protective coating is a Si/Ru coating that comprises a Ru layer formed on the ceramic substrate heater and a Si layer on the Ru layer.

BRIEF DESCRIPTION OF THE DRAWINGS

In the drawings:

FIGS. 7A-7K schematically show cross-sectional views of a ceramic substrate heater during processing of a substrate according to an embodiment of the invention;

DETAILED DESCRIPTION OF THE INVENTION

Figure 1:
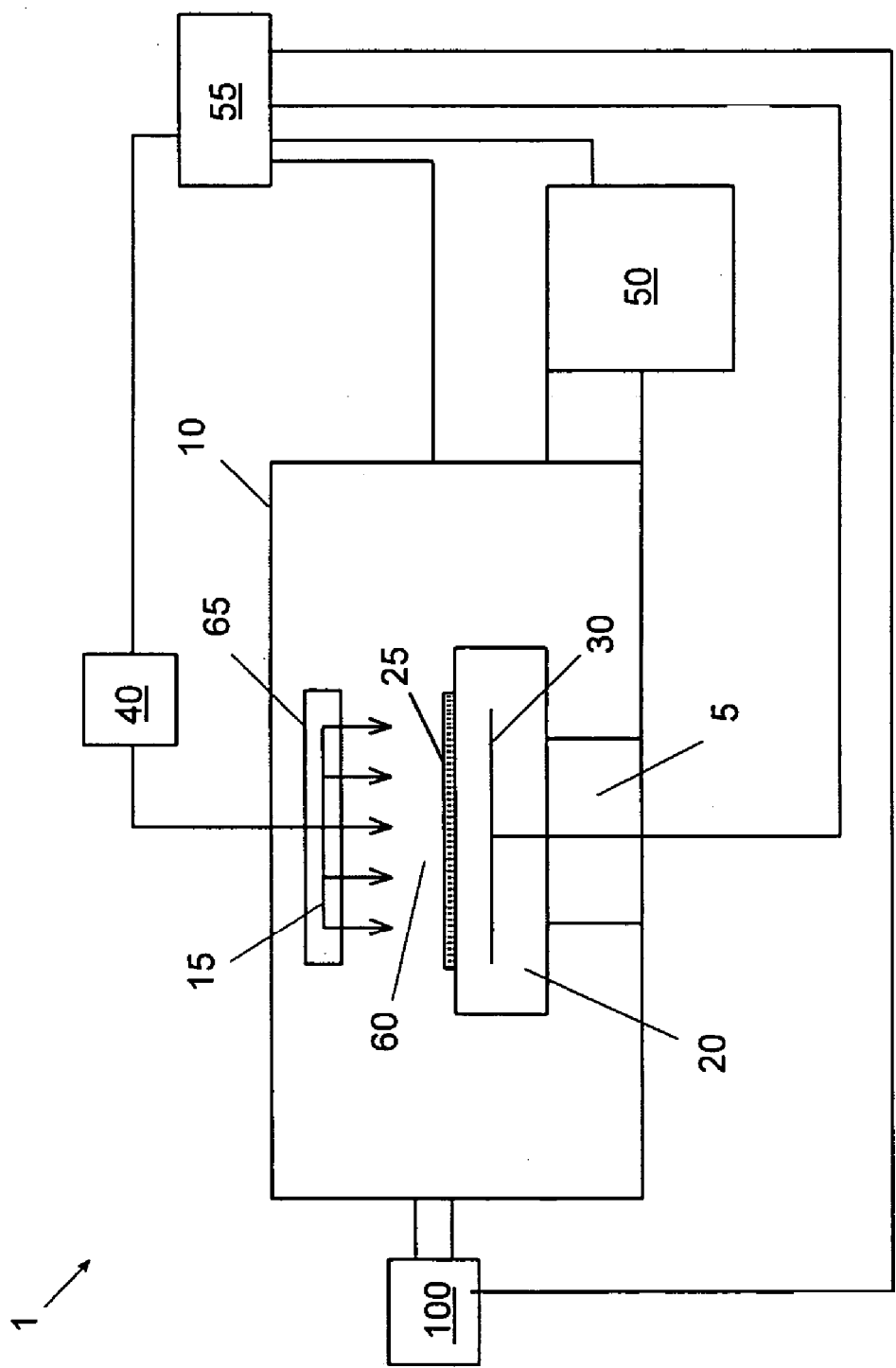
FIGS. 1-5 show schematic diagrams of processing systems for performing the method of the invention.

As noted in the Background of the Invention section above, contacting a substrate with a substrate heater or a material coating on a substrate heater can result in backside contamination of the substrate. Furthermore, formation of a partial coating on a ceramic substrate heater during processing of a substrate can result in non-uniform temperature distribution in the ceramic substrate heater and the overlying substrate. Furthermore, the temperature non-uniformity within the ceramic substrate heater can lead to mechanical damage to the heater, such as cracking of the ceramic material. Nevertheless, processing methods that solve these problems have not been reported, perhaps due to the difficulty of implementing new methods for protecting the ceramic substrate heaters while ensuring compliance with semiconductor processing, e.g., avoiding contamination of the backside of the substrate in contact with the ceramic substrate heater (backside contamination).

Thus, the present inventors have conducted experiments to analyze the process of forming a protective coating on the ceramic substrate heater surfaces to improve temperature uniformity of the ceramic substrate heater, and contacting a substrate with the protective coating to reduce backside contamination of the substrate. As a result of such experiments and analysis, the present inventors have discovered that forming a protective coating on a ceramic heater surface provides a feasible mechanism for protecting the ceramic substrate heater during subsequent processing of a substrate in a process chamber while ensuring compliance with semiconductor processing. In the present invention, a protective coating refers to a coating on a ceramic substrate heater where the coating contains one or more layers of different materials, and includes at least a surface portion upon which the substrate will be placed that is a non-metal layer or a combined metal/non-metal layer. For example, a Si/Ru protective coating has a Si (non-metal) layer on top of a Ru layer. A non-metal layer is any layer that is absent a metal. Silicon and carbon layers are examples of non-metal layers. The absence of a metal adjacent the substrate protects the substrate from backside contamination. The underlying Ru metal layer provides temperature uniformity to further protect the heater from damage. A combined metal/non-metal layer refers to such layers as metal oxides, metal nitrides, metal silicides, etc. These combined layers may be formed by first forming a metal layer and thereafter converting the layer by reacting the metal with a non-metal, such as by oxidizing, nitriding, etc. Alternately, these combined layers may be formed by exposing the substrate heater to a metal-containing gas and a non-metal-containing gas simultaneously to react the metal and non-metal before or as they deposit on the substrate heater.

When present, the combined metal/non-metal layer may form the surface portion only of the protective coating or may form the entire protective coating including the surface portion. Alternatively, in other exemplary embodiments of the invention, the combined metal/non-metal layer may be an intermediate layer between a metal underlayer and a non-metal layer surface portion, or may be an underlayer formed on the ceramic substrate heater and upon which the non-metal layer surface portion is formed. In another embodiment of the invention, the protective coating does not contain a combined metal/non-metal layer, and does contain at least a metal layer and a non-metal layer surface portion.

Referring now to the Figures, FIG. 1 shows a processing system in which the method of the invention may be performed. The processing system 1 includes a process chamber 10 having a pedestal 5 for mounting a substrate heater 20 for supporting and heating a substrate 25, a gas injection system 40 for introducing a gas 15 to the process chamber 10, and a vacuum pumping system 50. The gas 15 can, for example, be a reactant gas for forming a protective coating on the substrate heater 20, or a process gas for processing the substrate 25 supported by the substrate heater 20. The gas injection system 40 allows independent control over the delivery of gas 15 to the process chamber from ex-situ gas sources (not shown). Gases can be introduced into the process chamber 10 via the gas injection system 40 and the process pressure is adjusted. For example, controller 55 is used to control the vacuum pumping system 50 and gas injection system 40.

Substrate 25 is transferred into and out of chamber 10 through a slot valve (not shown) and chamber feed-through (not shown) via a robotic substrate transfer system 100 where it is received by substrate lift pins (not shown) housed within substrate heater 20 and mechanically translated by devices housed therein. Once the substrate 25 is received from the substrate transfer system, it is lowered to an upper surface of the substrate heater 20. The substrate 25 can be centered by a groove in the substrate heater 20 or by a centering ring (not shown). Furthermore, the substrate 25 can be mechanically or electrostatically clamped to the substrate heater 20 (not shown).

Furthermore, the substrate heater 20 can further include a cooling system including a re-circulating coolant flow that receives heat from the substrate heater 20 and transfers heat to a heat exchanger system (not shown). Moreover, gas (e.g., He) may be delivered to the backside of the substrate to improve the gas-gap thermal conductance between the substrate 25 and the substrate heater 20. Such a system is utilized when temperature control of the substrate is required at elevated or reduced temperatures.

The substrate heater 20 can be a ceramic substrate heater containing a heating element 30. The heating element 30 can, for example, be a resistive heating element. The ceramic substrate heater material can, for example, include $Al_2O_3$, AlN, SiC, or BeO or any combination of two or more thereof.

With continuing reference to FIG. 1, gas 15 is introduced to the processing region 60 from the gas injection system 40. The gas 15 can be introduced to the processing region 60 through a gas injection plenum (not shown), a series of baffle plates (not shown) and a multi-orifice showerhead gas injection plate 65. In one embodiment of the invention, the gas injection system 40 can be configured to facilitate rapid cycling of gases for an atomic layer deposition (ALD) process. Vacuum pump system 50 can include a turbo-molecular vacuum pump (TMP) capable of a pumping speed up to 5,000 liters per second (and greater), and a gate valve for throttling the chamber pressure. TMPs are useful for low pressure processing, typically less than 50 mTorr. For high pressure processing (i.e., greater than 100 mTorr), a mechanical booster pump and dry roughing pump can be used.

The controller 55 includes a microprocessor, a memory, and a digital I/O port capable of generating control voltages sufficient to communicate and activate inputs to the processing system 1 as well as monitor outputs from the processing system 1. Moreover, the controller 55 is coupled to and exchanges information with the process chamber 10, gas injection system 40, heating element 30, substrate transfer system 100, and vacuum pump system 50. For example, a program stored in the memory can be utilized to control the aforementioned components of a processing system 1 according to a stored process recipe. One example of controller 55 is a digital signal processor (DSP); model number TMS320, available from Texas Instruments, Dallas, Tex.

In the embodiment shown in FIG. 1, the processing system 1 can, for example, be utilized for performing a thermal process, such as a thermal chemical vapor deposition (TCVD) process, or an ALD process.

Figure 2:
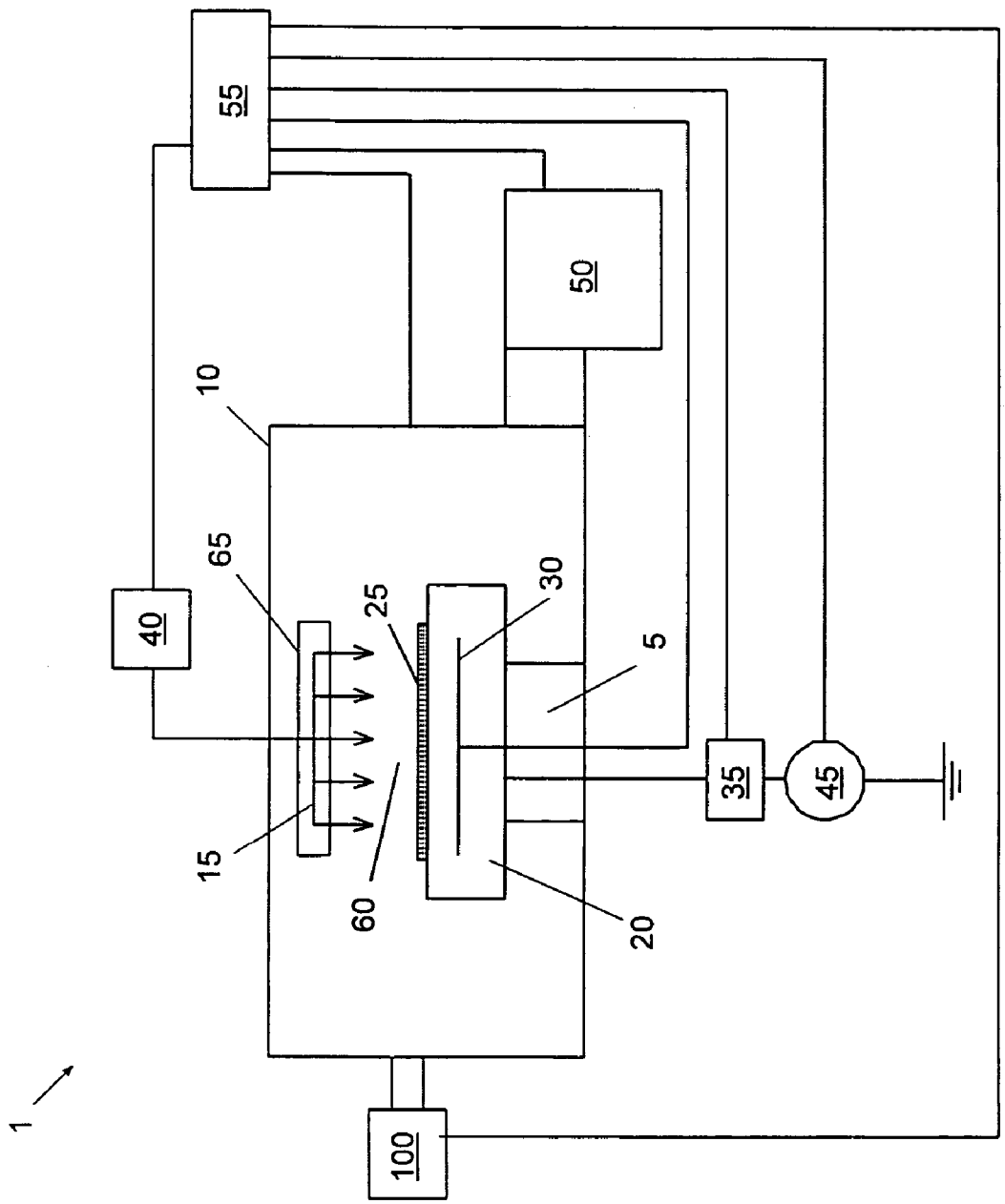

FIG. 2 shows an alternate processing system 1 for performing the method of the invention. In FIG. 2, the processing system 1 is capable of forming and sustaining a plasma in the process chamber 10. The plasma processing system 1 can, for example, be utilized for performing a plasma enhanced chemical vapor deposition process (PECVD), or a plasma etch process. In the embodiment shown in FIG. 2, the substrate heater 20 can further serve as an electrode through which radio frequency (RF) power is coupled to plasma in the processing region 60. For example, a metal electrode (not shown) in the substrate heater 20 can be electrically biased at a RF voltage via the transmission of RF power from a RF generator 45 through an impedance match network 35 to the substrate heater 20. The RF bias serves to excite electrons and, thereby, form and sustain a plasma. In this configuration, plasma is utilized either to deposit material to a substrate 25 (i.e., the processing system 1 can act as a PECVD reactor), or the to remove material from the exposed surface of the substrate 25 (i.e., the processing system 1 can act as a reactive ion etching (RIE) reactor). A typical frequency for the RF bias ranges from 1 MHz to 100 MHz and can be 13.56 MHz.

In an alternate embodiment, RF power can be applied to the substrate heater 20 at multiple frequencies. Furthermore, the impedance match network 35 serves to maximize the transfer of RF power to plasma in processing chamber 10 by minimizing the reflected power. Match network topologies (e.g., L-type, π-type, T-type) and automatic control methods are known in the art. In FIG. 2, the controller 55 is coupled to and exchanges information with the process chamber 10, the RF generator 45, the impedance match network 35, the gas injection system 40, the substrate transfer system 100, and the vacuum pump system 50.

Figure 3:
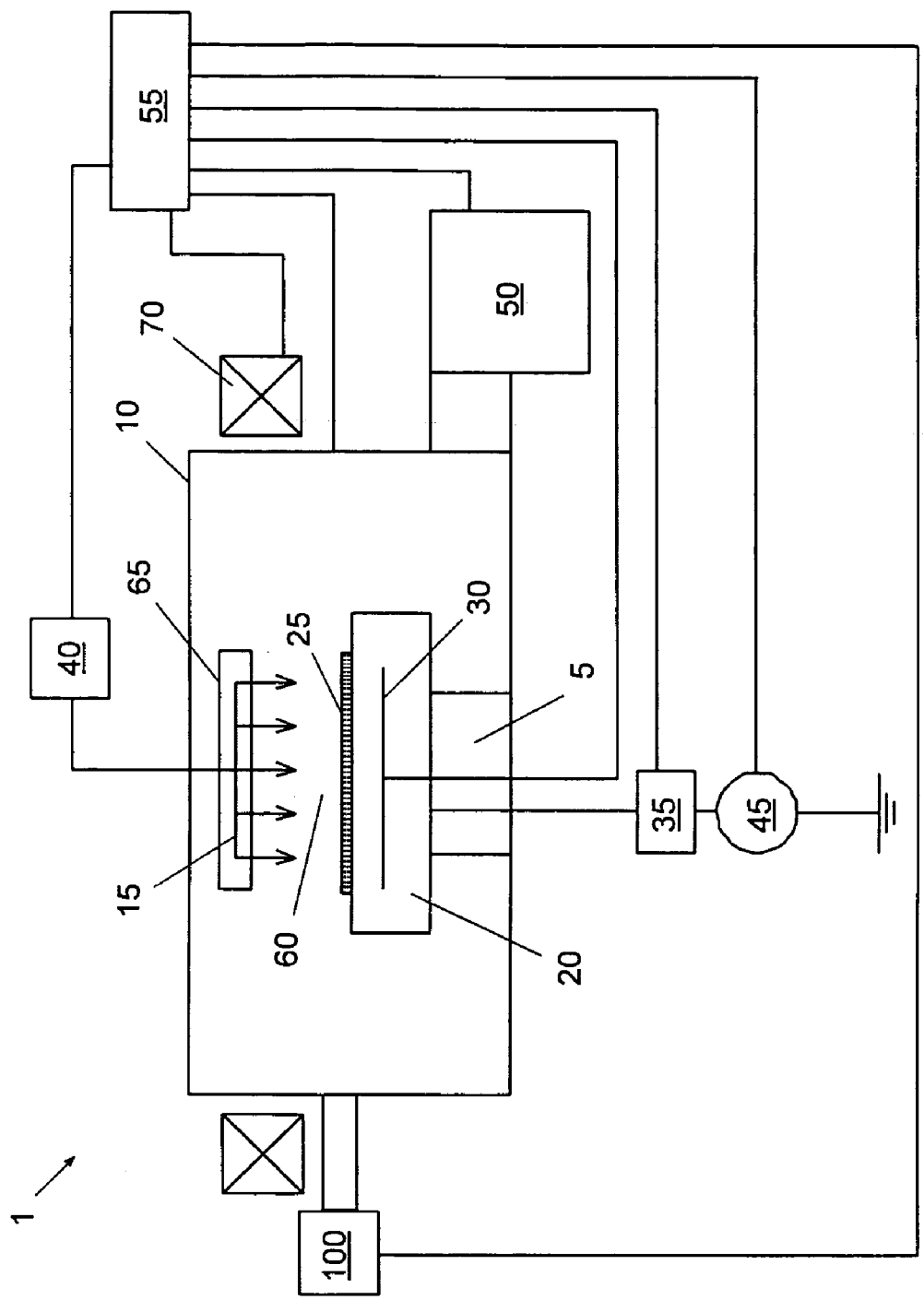

FIG. 3 shows another alternate processing system 1 for performing the method of the invention. The processing system 1 of FIG. 3 further includes either a mechanically or electrically rotating DC magnetic field system 70 to potentially increase plasma density and/or improve plasma processing uniformity, in addition to those components described with reference to FIG. 2. Moreover, the controller 55 is coupled to the rotating magnetic field system 70 in order to regulate the speed of rotation and field strength.

Figure 4:
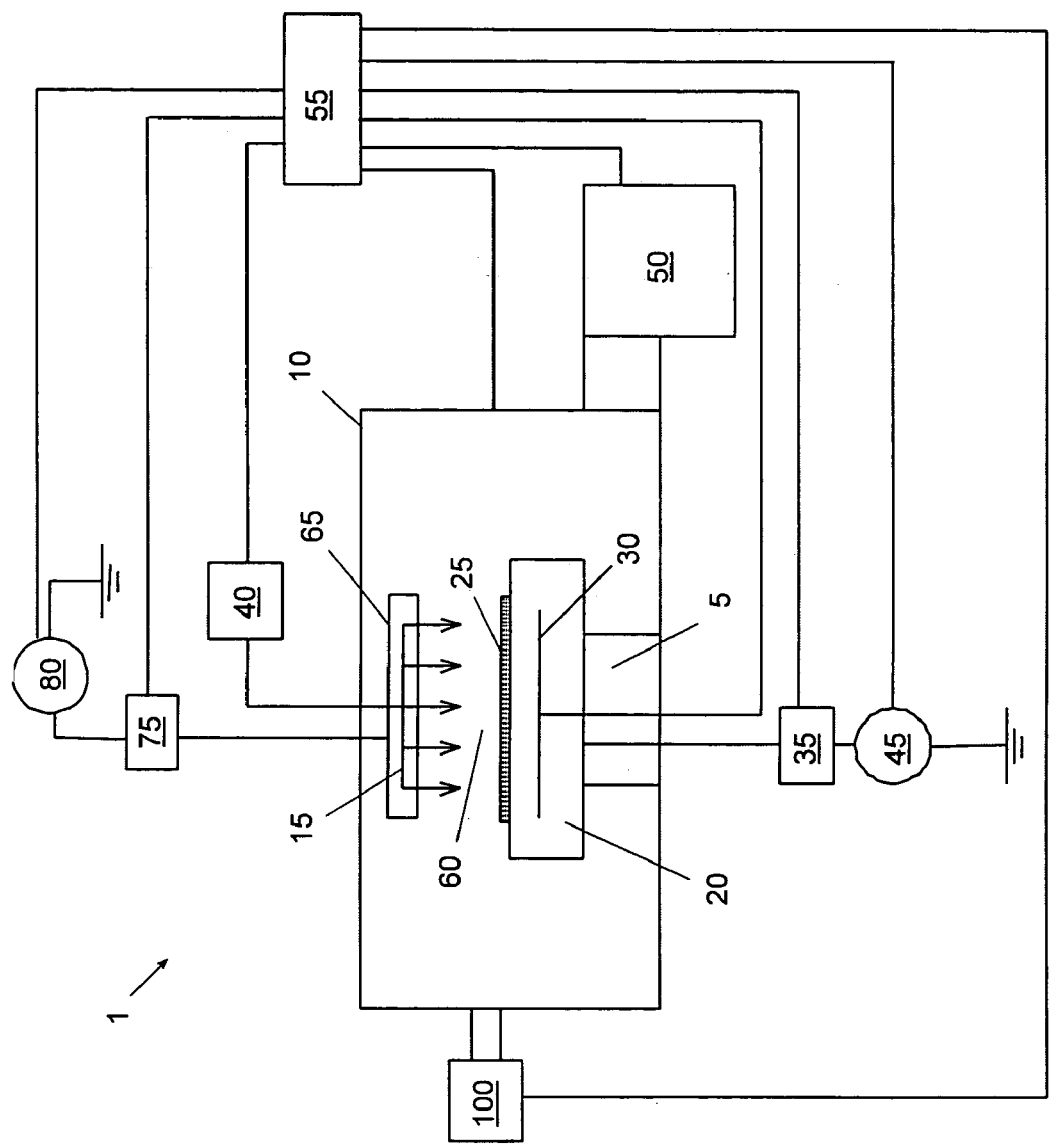

FIG. 4 shows yet another alternate plasma processing system 1 for performing the method of the invention. The processing system 1 of FIG. 4 includes a multi-orifice showerhead gas injection plate 65 that can also serve as an upper plate electrode to which RF power is coupled from an RF generator 80 through an impedance match network 75. A typical frequency for the application of RF power to the upper electrode ranges from 10 MHz to 200 MHz and can be 60 MHz. Additionally, a typical frequency for the application of power to the lower electrode ranges from 0.1 MHz to 30 MHz and can be 2 MHz. Moreover, the controller 55 is coupled to the RF generator 80 and the impedance match network 75 in order to control the application of RF power to the upper electrode 65.

In one embodiment of the invention, the substrate heater 20 in FIG. 4 can be electrically grounded. In an alternate embodiment, a DC bias can be applied to the substrate heater 20. In still another embodiment, the substrate heater 20 can be electrically isolated from the plasma processing system 1. In this setup, a floating potential can be formed on the substrate heater 20 and on the substrate 25 when the plasma is on.

Figure 5:
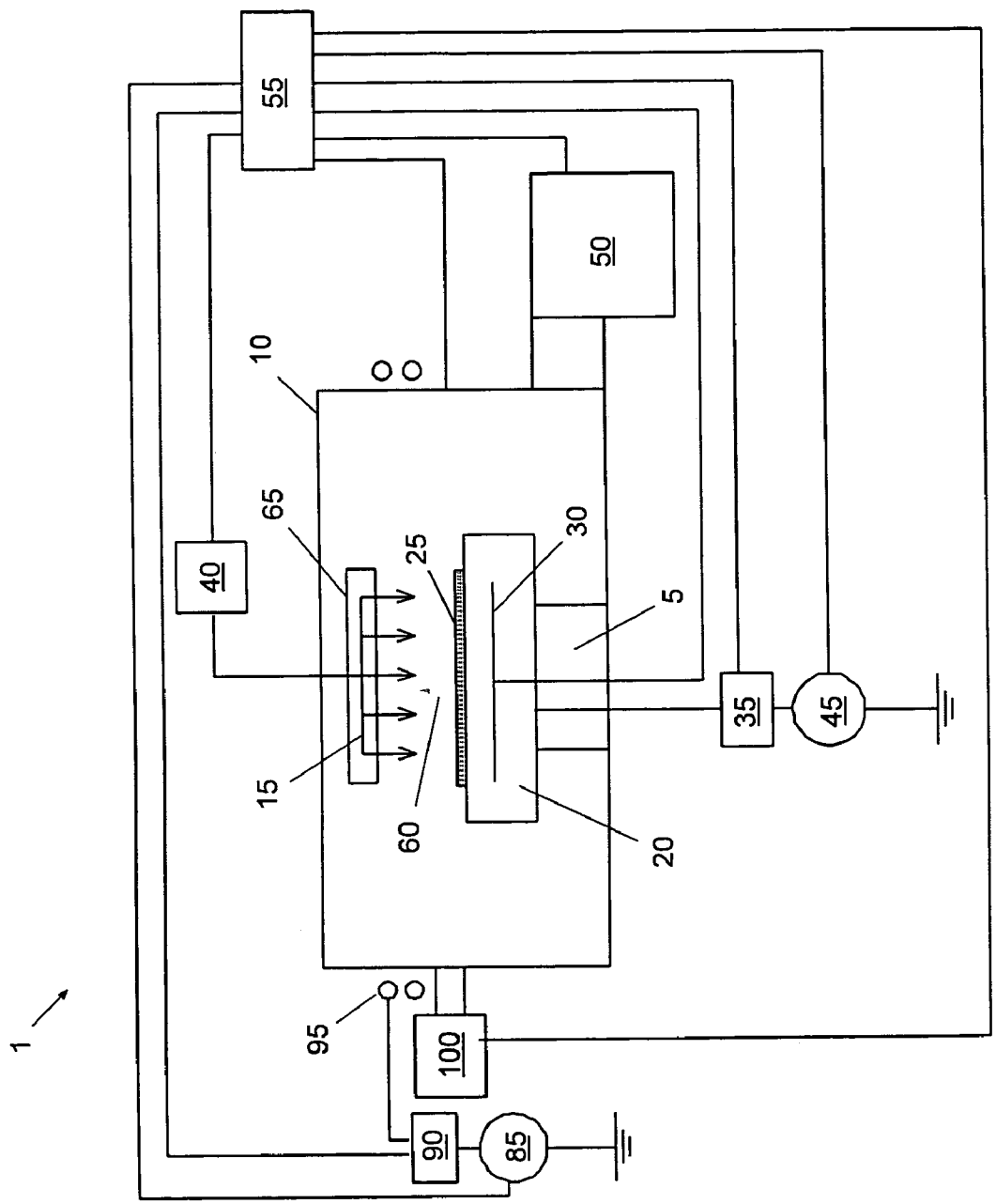

FIG. 5 shows yet another processing system 1 for performing the method of the present invention. The processing system 1 of FIG. 2 is modified to further include an inductive coil 95 to which RF power is coupled via an RF generator 85 through an impedance match network 90. RF power is inductively coupled from the inductive coil 95 through a dielectric window (not shown) to the processing region 60. A typical frequency for the application of RF power to the inductive coil 80 ranges from 10 MHz to 100 MHz and can be 13.56 MHz. Similarly, a typical frequency for the application of power to the substrate heater 20 ranges from 0.1 MHz to 30 MHz and can be 13.56 MHz. In addition, a slotted Faraday shield (not shown) can be employed to reduce capacitive coupling between the inductive coil 95 and plasma. Moreover, the controller 55 is coupled to the RF generator 85 and the impedance match network 90 in order to control the application of power to the inductive coil 95.

In another embodiment, the plasma is formed using electron cyclotron resonance (ECR). In yet another embodiment, the plasma is formed from the launching of a Helicon wave. In still another embodiment, the plasma is formed from a propagating surface wave.

In one embodiment of the invention, the substrate heater 20 can be electrically grounded. In an alternate embodiment, a DC bias can be applied to the substrate heater 20. In still another embodiment, the substrate heater 20 can be electrically isolated from the plasma processing system 1. In this setup, a floating potential can be formed on the substrate heater 20 and on the substrate 25 when the plasma is on.

It is to be understood that the processing systems in FIGS. 1-5 are for exemplary purposes only, as many variations of the specific hardware and software can be used to implement systems in which the method of the present invention may be practiced, and these variations will be readily apparent to one having ordinary skill in the art.

In one embodiment of the invention, processing of substrates in the exemplary processing systems shown in FIGS. 1-5 can form a coating on system components within the process chamber. The coating can contain one or more types of material if multiple processes are performed in the processing system. For example, the coating can contain metal layers containing tungsten (W), rhenium (Re), Ru, titanium (Ti), or tantalum (Ta), deposited during TCVD or PECVD processes, or any combination of two or more thereof.

Figure 6B:
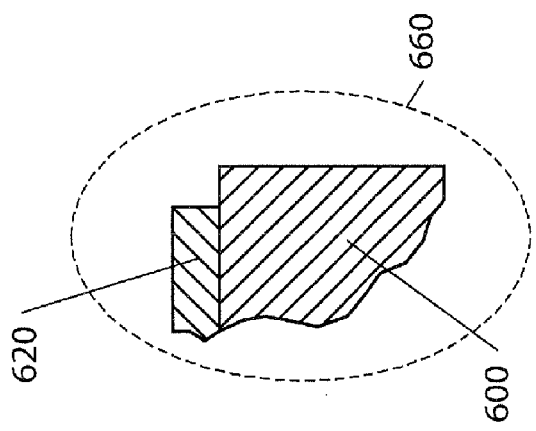
FIGS. 6A-6G schematically show cross-sectional views of a ceramic substrate heater during processing of a substrate.
Figure 6D:
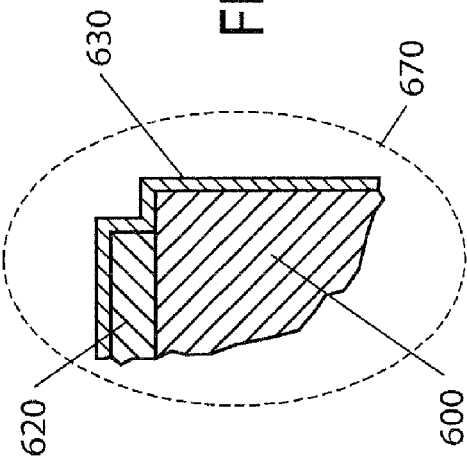
Figure 6A:
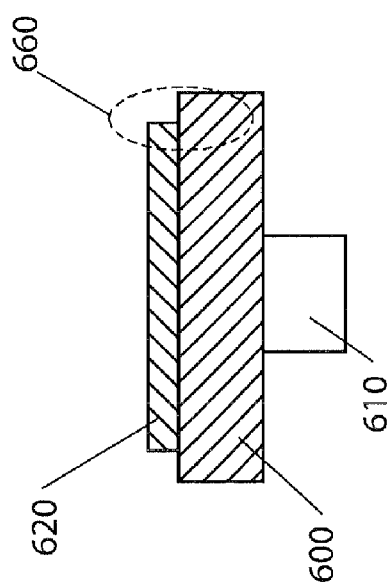
Figure 6C:
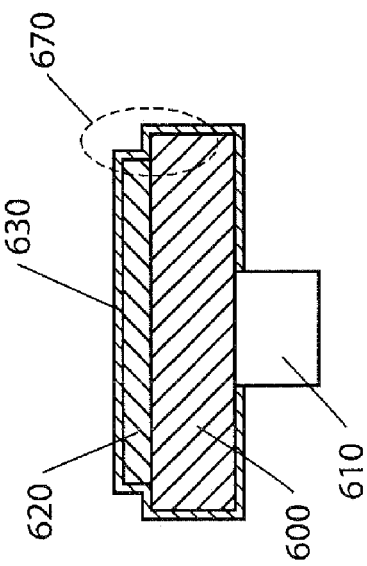

FIGS. 6A-6G schematically show cross-sectional views of a ceramic substrate heater during processing of a substrate. FIG. 6A shows a substrate 620 residing on a ceramic substrate heater 600 that is supported by a pedestal 610. The substrate 620 can be transferred to and from the ceramic substrate heater 600 in the processing system by a substrate transfer system, for example as shown in any of FIGS. 1-5. FIG. 6B shows an expanded view of portion 660 of FIG. 6A. The substrate 620 can, for example, be a semiconductor wafer of any size, including a 200 mm substrate, a 300 mm substrate, or an even larger substrate. FIG. 6C shows a material coating 630 formed on the substrate 620 and on the ceramic substrate heater 600 during processing of the substrate 620. FIG. 6D shows an expanded view of portion 670 of FIG. 6C. The processing of the substrate 620 can, for example, include a semiconductor manufacturing process containing at least one of a thermal process, e.g., TCVD or ALD, and a plasma process, e.g., PECVD or an etching process. The material coating 630 can contain a single material or, alternately, it can contain various materials if multiple processes are performed in the process chamber. Furthermore, the thickness of the material coating 630 can be substantially uniform on the ceramic substrate heater 600 and on the substrate 620 or, alternately, the thickness of the material coating 630 can vary on the ceramic substrate heater 600 and the substrate 620. In one example, the coating 630 can be a metal film deposited by a TCVD process, for example a Ru film deposited using a $Ru_3(CO)_{12}$ precursor at a substrate temperature of 420° C.

Figure 6F:
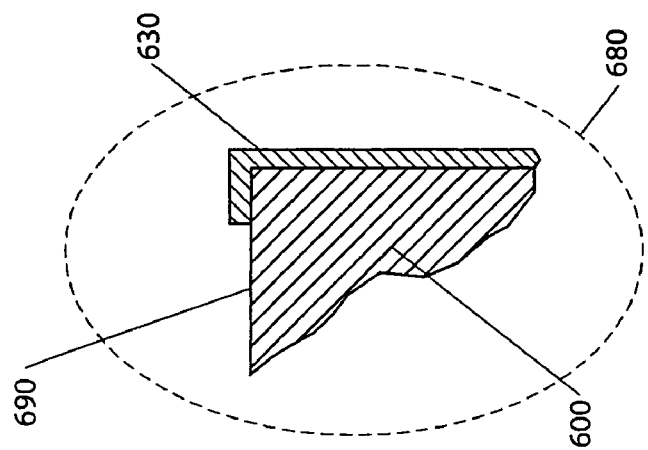
Figure 6E:
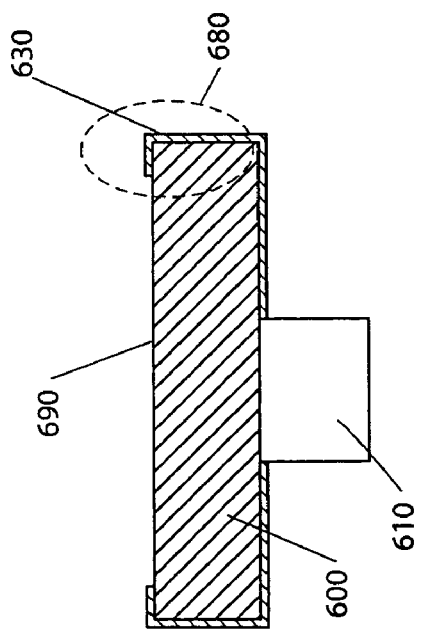
Figure 6G:
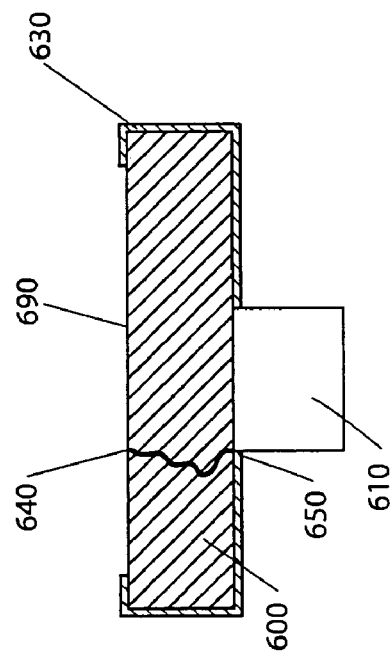

FIG. 6E shows a partially coated ceramic substrate heater 600. In FIG. 6E, the substrate 620 has been removed from the ceramic substrate heater 600 following processing of the substrate 620 in FIG. 6D, revealing an uncoated surface 690. The coating 630 covers parts of the substrate heater 600 that were exposed to the process environment during processing of the substrate 620. FIG. 6F shows an expanded view of portion 680 of FIG. 6E. The current inventors have observed that processing a substrate 620 as depicted in FIGS. 6A-6F, can result in mechanical failure of the substrate heater 600 as shown in FIG. 6G, where the ceramic substrate heater 600 has developed a crack 640, that can originate at point 650, where the ceramic substrate heater 600 is supported by the pedestal 610, and travel through the body of the ceramic substrate heater 600 to the surface 690.

The presence of the non-continuous coating 630 on the ceramic substrate heater 600, as schematically shown in FIG. 6F, can lower the emittance (E, the radiant flux per unit area emitted) from areas of the ceramic substrate heater 600 containing the coating 630, compared to the emittance from an un-coated area of the ceramic substrate heater 600, such as the surface 690. The current inventors believe that a mechanical failure of the ceramic substrate heater 600, as shown in FIG. 6G, can result from thermal non-uniformity and thermal stressing of the ceramic substrate heater 600 due to partial coating of the ceramic substrate heater 600.

Contacting the substrate 620 directly with the material of the ceramic substrate heater 600 may lead to backside contamination of the substrate 620. In addition, the outside edge of the next substrate to be processed on the substrate heater 600 may come in contact with the coating 630 and result in contamination of the substrate from the coating 630, in addition to possible contamination from the material of the substrate holder 600.

In the current invention, backside contamination of a substrate in contact with a ceramic substrate heater may be reduced by forming a protective coating on the substrate heater prior to contacting the substrate with the substrate heater. To reduce the backside contamination, the protective coating may contain a non-metal layer at the surface in contact with the substrate. The non-metal layer is formed by exposing the substrate heater to a non-metal containing gas. In one example, the protective coating may contain a metal layer (e.g., Ru) formed on the substrate heater and a non-metal surface layer (e.g., Si, $SiO_2$, SiN) formed on the metal layer. Thus, during processing, a substrate (e.g., a Si wafer) is in contact with the non-metal surface layer and backside contamination is reduced. The metal layer is formed by exposing the substrate heater to a metal-containing gas, and it improves temperature distribution during processing of a substrate and further protects the substrate heater material. In this embodiment, the protective coating can be formed by sequentially exposing the substrate heater to a metal-containing gas and then to a non-metal containing gas. In addition, the non-metal containing gas may include one or more such gases, for example a silicon-containing gas, an oxygen-containing gas, a nitrogen-containing gas, and/or a carbon-containing gas, and these gases may be introduced simultaneously or sequentially. For example, a $SiO_2$ layer may be formed by first exposing the substrate heater to a silicon-containing gas to deposit silicon, and then to an oxygen-containing gas to react oxygen with silicon to form $SiO_2$.

Alternately, to reduce the backside contamination, the protective coating may contain a combined metal/non-metal layer at the surface in contact with the substrate. In one example, the protective coating may contain a metal oxide (e.g., $Ru_2O_3$), metal nitride (e.g., TiN), metal carbide (e.g., WC), or metal silicide (e.g., $TaSi_3$) layer alone, or formed on a metal layer. For example, the protective coating may include a Ru layer formed on the substrate and a $Ru_2O_3$ layer formed on the Ru layer. The combined metal/non-metal layer may be formed by first exposing the substrate heater to a metal-containing gas to deposit the metal and then exposing the deposited metal to a non-metal gas to react the non-metal with the metal and thereby convert the deposited metal to a metal/non-metal layer. Alternately, the substrate heater may be exposed simultaneously to both a metal-containing gas and non-metal-containing gas to form the combined layer.

In another alternate embodiment, the protective coating may contain a metal layer formed on the substrate heater, a combined metal/non-metal layer formed on the metal layer, and a non-metal layer formed on the combined layer.

Figure 7D:
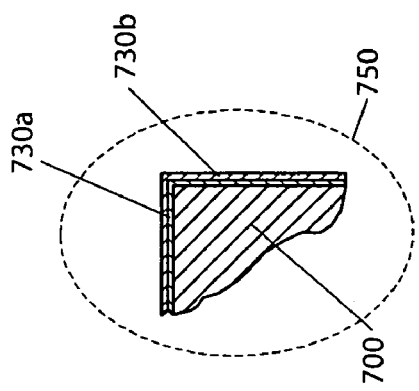
Figure 7C:
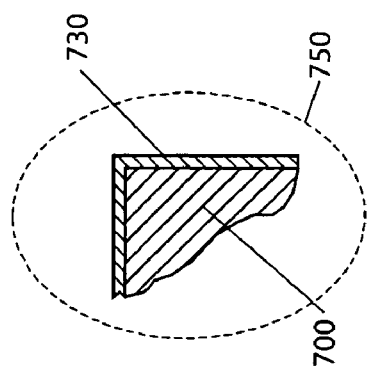
Figure 7F:
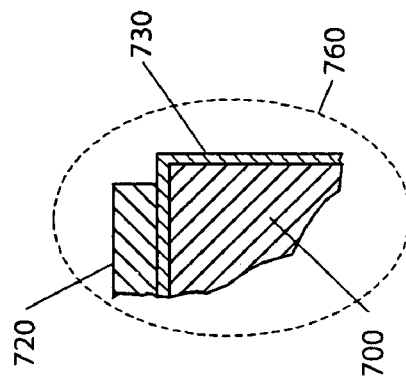
Figure 7B:
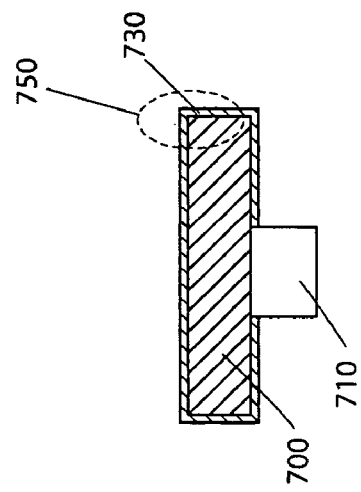
Figure 7E:
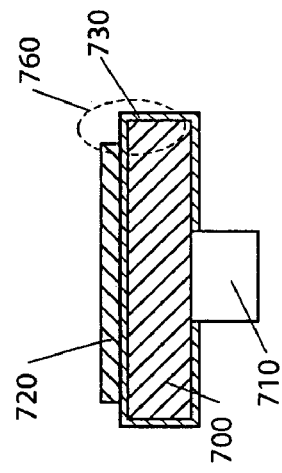
Figure 7A:
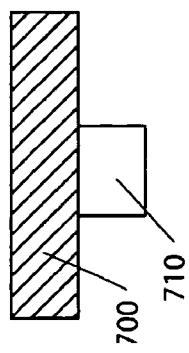

FIGS. 7A-7I schematically show cross-sectional views of a ceramic substrate heater according to an embodiment of the invention. FIG. 7A shows a ceramic substrate heater 700 supported by a pedestal 710. FIG. 7B shows a ceramic substrate heater 700 having a protective coating 730 deposited thereon according to an embodiment of the invention. FIG. 7C shows an expanded view of portion 750 of FIG. 7B. The protective coating 730 can be formed, as described above, by simultaneously or sequentially flowing reactant gases into the process chamber and exposing the ceramic substrate heater to the gases in a TCVD process or PECVD process.

In one embodiment of the invention, the protective coating 730 can contain a metal layer or a metal/non-metal layer. The metal can, for example, be at least one of W, Re, Ru, Ti, Ta, nickel (Ni), molybdenum (Mo), and chromium (Cr). The metal/non-metal layer can further contain non-metallic elements, for example silicon (Si), carbon (C), oxygen (O), and nitrogen (N). In another embodiment of the invention, the protective coating 730 can contain a non-metal layer. The non-metal layer can, for example, be at least one of Si, C, silicon oxide, or silicon nitride. In an exemplary embodiment, as shown in FIG. 7D in an expanded view of portion 750 of FIG. 7B, protective coating 730 includes a metal layer 730$a$, such as a Ru layer, formed on substrate heater 700 and a non-metal layer 730$b$, such as a Si layer, formed on metal layer 730$a$.

In one embodiment of the invention, the reactant gas can contain a metal-containing gas, for example a metal-carbonyl gas selected from $Ru_3(CO)_{12}$, $Ni(CO)_4$, $Mo(CO)_6$, $Co_2(CO)_8$, $Rh_4(CO)_{12}$, $Re_2(CO)_{10}$, and $Cr(CO)_6$ and any combinations thereof. Alternately, the reactant gas can contain a metal halide gas. The reactant gas can further contain a silicon-containing gas, for example silane ($SiH_4$), disilane ($Si_2H_6$), dichlorosilane ($SiCl_2H_2$), or hexachlorodisilane ($Si_2Cl_6$) or combinations thereof; a hydrocarbon gas, for example an alkane ($C_nH_{2n+2}$), an alkene ($C_nH_{2n}$), or an alkyne ($C_nH_n$) or combinations thereof; an oxygen-containing gas including $O_2$, $O_3$, $CO_2$, or CO or combinations thereof; and a nitrogen-containing gas including $N_2$, NO, $NO_2$, or $N_2O$ or combinations thereof. Furthermore, the reactant gas can contain an inert gas selected from He, Ne, Ar, Kr, and Xe and combinations thereof.

The protective coating can be formed by heating the substrate heater to between about 100° C. and about 800° C. and exposing the substrate heater to a reactant gas. Alternatively, the ceramic substrate heater can be heated to between about 300° C. and about 600° C.

FIG. 7E shows a substrate 720 residing on the coated ceramic substrate heater 700. FIG. 7F shows an expanded view of portion 760 of FIG. 7E. FIG. 7G shows a coating 740 formed on the protective coating 730 and on the substrate 720 during processing of the substrate 720. The coating 740 may be a metal film, for example, a film of one or more of the same metals contained in the coating 730. FIG. 7H shows an expanded view of portion 770 in FIG. 7G. The processing of the substrate 720 can be a semiconductor manufacturing process, for example, a TCVD process, a PECVD process, or an ALD process, and may include sequential operation of two or more of these processes. FIG. 7I shows a coated ceramic substrate heater 700 following removal of the processed substrate 720. FIG. 7J shows an expanded view of portion 780 in FIG. 7I. The coated ceramic substrate heater 700 contains the protective coating 730 on the surface that supported the substrate 720, and coatings 730 and 740 on parts of the ceramic substrate heater 700 not used to support the substrate 720, i.e., surface portions that remain exposed when the substrate 720 is placed on the substrate heater 700. Next, additional substrates can be processed on the same protective coating. Alternatively, a new protective coating 790 can be formed on the coatings 730 and 740, as depicted in FIG. 7K, which is an expanded view of FIG. 7I after applying the new protective coating 790. The processing of a substrate followed by forming a new protective coating can be repeated a desired number of times to process a plurality of substrates before performing a cleaning process to remove the initial protective coating 730 and the repeating 740 and 790 layers. Alternatively, a cleaning process can be carried out to remove coatings 730 and 740 from the ceramic substrate heater 700, before forming a new protective coating 730 on a clean ceramic substrate heater 700.

The new protective coating 790 may have the same composition as the preceding protective coating, or alternately, the new coating 790 may have a different composition. In one example, a Si/Ru protective coating 730 can be formed on a substrate heater 700, as shown in FIG. 7D, such that the protective coating has a first metal (Ru) layer 730a and non-metal (Si) layer surface portion 730b, and following processing of at least one substrate 720 where a second metal layer (e.g., Ru) may be deposited on the substrate 720 and on areas of the surface portion 730b of the protective coating 730 not shielded by the substrate 720, a new non-metal layer 790, such as a Si layer, can be deposited onto the coated substrate heater, prior to processing the next substrate. Specifically, the new non-metal layer 790 is deposited over the metal layer formed on the exposed areas of surface portion 730b during processing of the substrate and on the surface portion 730b that was shielded by the substrate. Thus, the next substrate will be in contact with the new non-metal (e.g., Si) layer 790 and backside contamination is thereby reduced. Alternately, a new Si/Ru protective coating 790 may be deposited onto the coated substrate heater.

Figure 8:
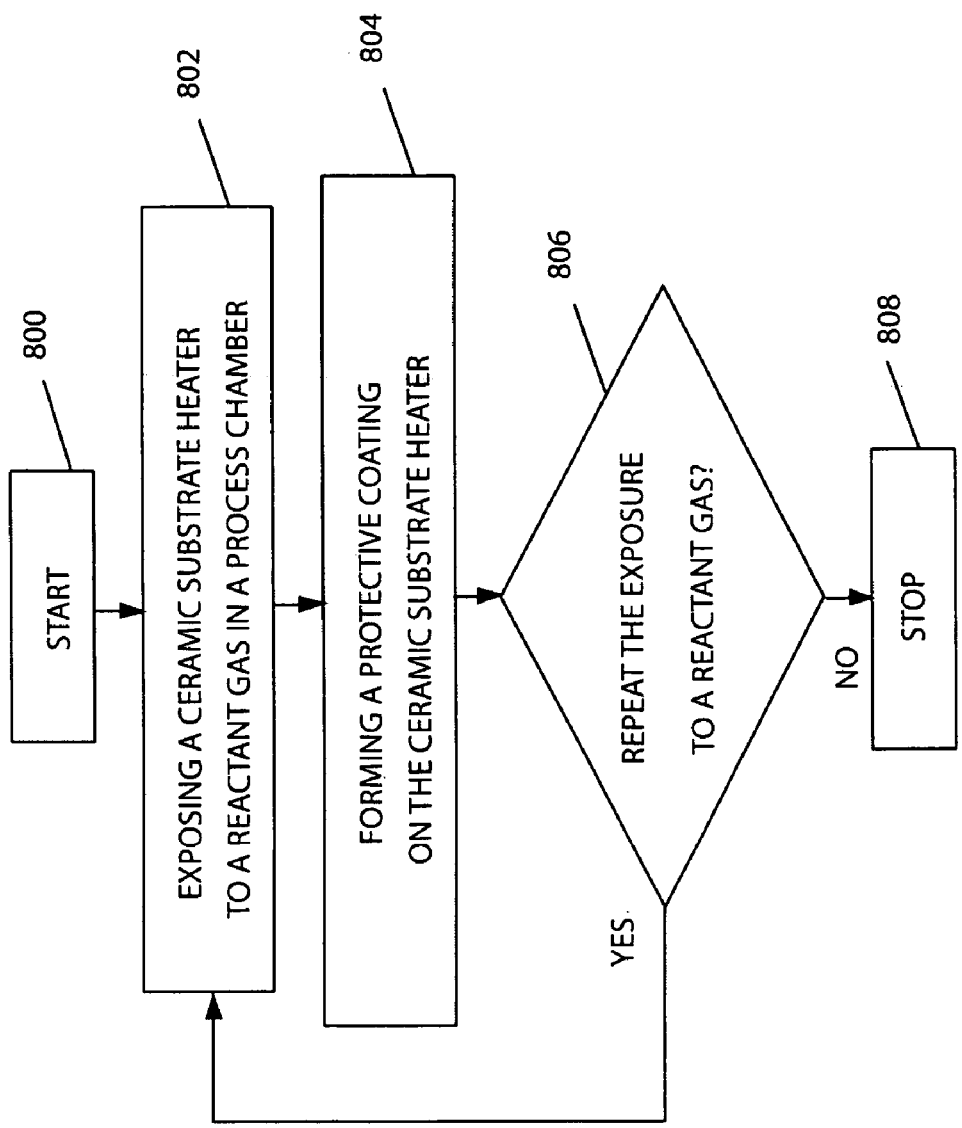
FIG. 8 is a flowchart showing a method of forming a protective coating on a ceramic substrate heater according to an embodiment of the invention.

FIG. 8 is a flowchart showing a method of forming a protective coating on a ceramic substrate heater according to an embodiment of the invention. At 800, the process is started. At 802, a ceramic substrate heater is exposed to a reactant gas in a process chamber. At 804, a protective coating is formed on the ceramic substrate heater from the reactant gas. At 806, a decision is made whether to return to 802 and expose the ceramic substrate heater to a reactant gas, or to stop the process at 808 if the desired protective coating is formed on the ceramic substrate heater. If a decision is made at 808 to return to 802, the reactant gas can be the same as in the previous exposure step, or alternatively, the reactant gas can be a different gas.

Figure 9:
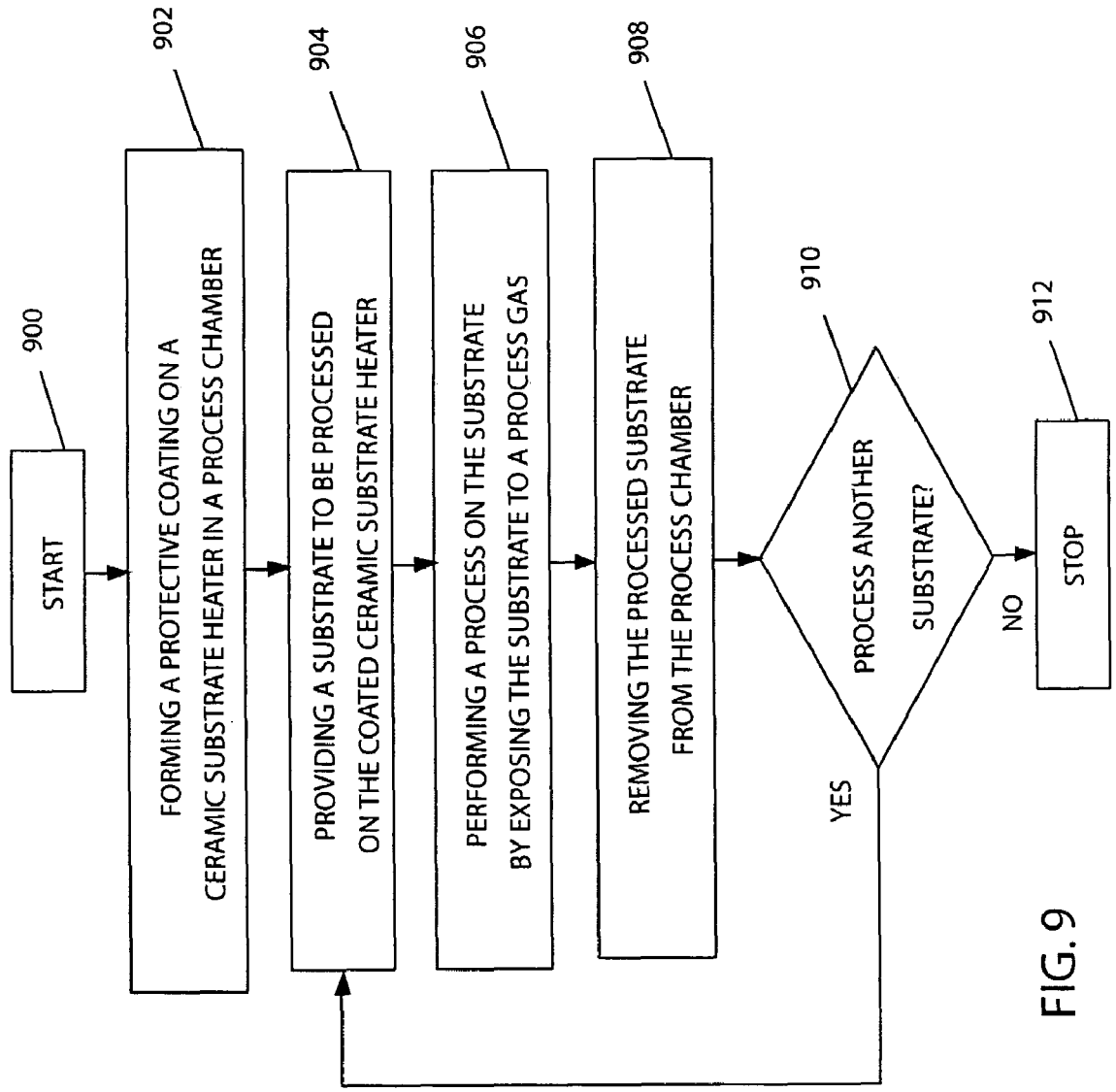
FIG. 9 is a flowchart showing a method of forming a protective coating on a ceramic substrate heater and processing a substrate according to an embodiment of the invention.

FIG. 9 is a flowchart showing a method of forming a protective coating on a ceramic substrate heater and processing a substrate according to an embodiment of the invention. The process can, for example, be a semiconductor manufacturing process performed by one of the processing systems shown in FIGS. 1-5. At 900, the process is started. At 902, a protective coating is formed on ceramic substrate heater in a process chamber. The protective coating can be formed as described in FIG. 8. At 904, a substrate to be processed is provided on the coated ceramic substrate heater. At 906, a process is performed on the substrate by exposing the substrate to a process gas, and at 908, the processed substrate is removed from the process chamber. At 910, a decision is made whether to process another substrate and return to 904, or to stop the process in 912.

Figure 10:
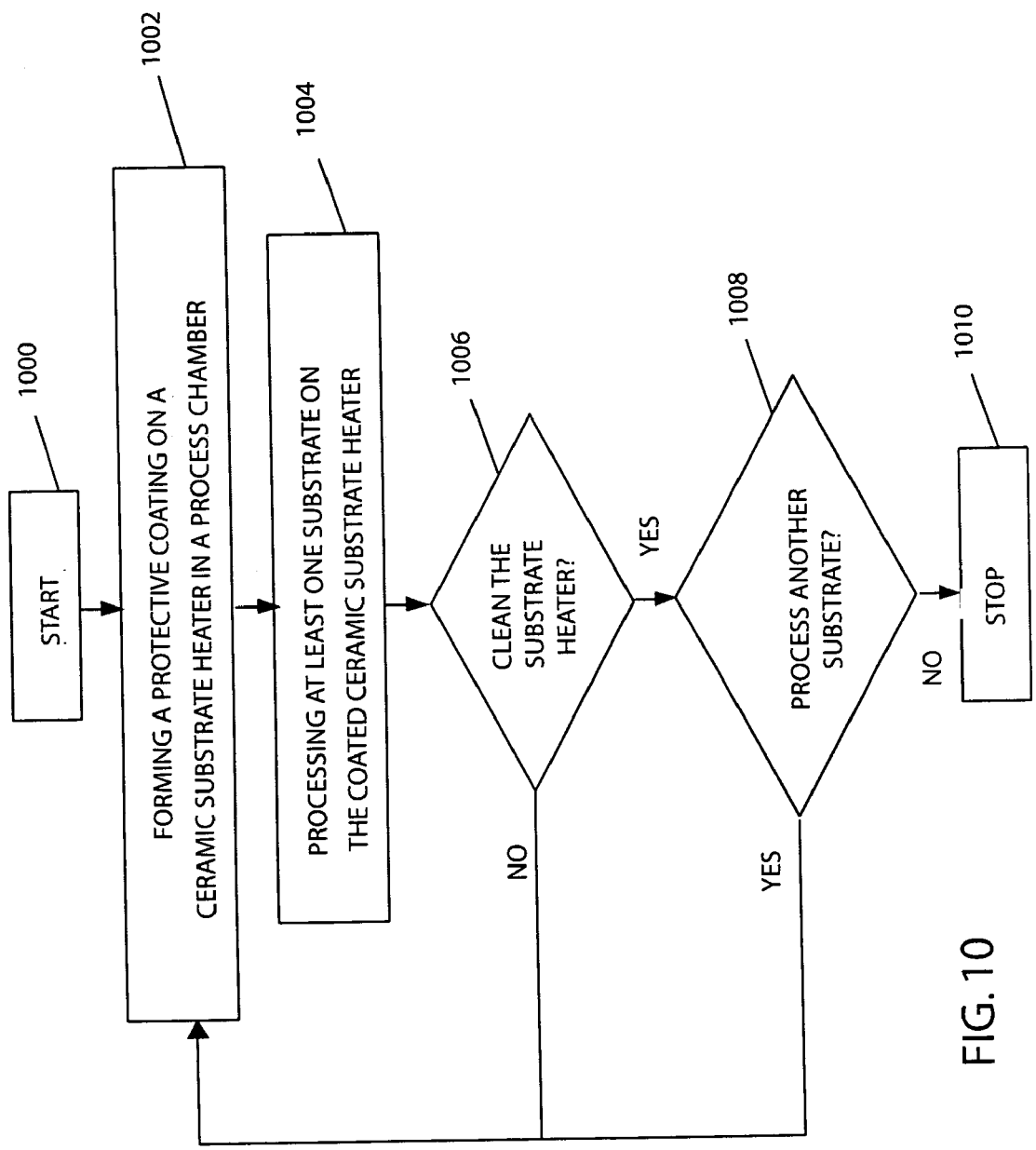
FIG. 10 is a flowchart showing a method of forming a protective coating on a ceramic substrate heater and processing a substrate according to an embodiment of the invention.

FIG. 10 is a flowchart showing a method of forming a protective coating on a ceramic substrate heater and processing a substrate according to an embodiment of the invention. At 1000, the process is started. In 1002, a protective coating is formed on a ceramic substrate heater in a process chamber. The protective coating can be formed as described in FIG. 8. At 1004, at least one substrate is processed on the coated ceramic substrate heater. The substrate may be processed as described in FIG. 9. At 1006, a decision is made whether to return to 1002 and form a new protective coating without cleaning the substrate heater, or to clean the substrate heater of the protective coating (and any additional coatings from processing a substrate) and subsequently form a new protective coating on the substrate heater. The new protective coating can contain the same material as the underlying coating, or alternately it can contain a different material. At 1008, a decision is made whether to process another substrate and return to 1002, or stop the process at 1010.

In one example of the present invention, metal contamination of a Si wafer was examined by comparing the use of a Si/Ru protective coating to a Ru coating. The Ru coating was formed on an AlN substrate heater by exposing the substrate heater to $Ru_3(CO)_{12}$ at 420° C. The thickness of the Ru coating was about 840 angstroms (Å). Subsequently, a 300 mm Si wafer was provided on the Ru-coated AlN substrate heater. The polished side of the Si wafer was placed in contact with the coated substrate heater. Following removal of the Si wafer from the coated substrate heater, Ru contamination on the polished side of the Si wafer was measured at $2.4 \times 10^{12}$ atoms/cm² using total reflection X-ray fluorescence (TXRF).

The Si/Ru protective coating was formed on an AlN substrate heater by first depositing a Ru coating on the heater as described in the example above, followed by depositing a Si layer on the Ru coating. The Si layer was deposited by exposing the Ru coating to silane ($SiH_4$) at a heater temperature of 550° C. Subsequently, a 300 mm Si wafer was provided on the Si/Ru coating. The polished side of the Si wafer was placed in contact with the coating. Following removal of the Si wafer from the coated substrate heater, Ru contamination on the polished side of the Si wafer was measured to be below the detection limit ($4.6 \times 10^{10}$ atoms/cm²) of the TXRF instrument.

In another embodiment of the invention, a Si/Ru coating $(Si/Ru)_n$ can be deposited by sequentially exposing the substrate heater n number of times to $Ru_3(CO)_{12}$ and $SiH_4$, where n>1.

In still another embodiment of the invention, a Si/Ru coating can be exposed to an oxygen-containing gas, such as $O_2$, to oxidize the Si layer.

In yet another embodiment of the invention, a Ru-containing protective coating can be deposited on a ceramic substrate heater by sequentially exposing the substrate heater to $Ru_3(CO)_{12}$, $SiH_4$, and $O_2$.

In an embodiment of the invention, a ceramic substrate heater containing a Si/Ru protective coating can be used to support a substrate. The substrate can be processed by depositing a Ru layer on the substrate at a temperature of about 420° C. Following processing of at least one substrate, a new Si layer can be deposited onto the coated substrate heater, prior to processing the next substrate. The new protective coating can, for example, be deposited at the same processing temperature as used for depositing the Ru layer.

Obviously, numerous modifications and variations of the present invention are possible in light of the above teachings. It is therefore to be understood that within the scope of the appended claims, the invention may be practiced otherwise than is specifically described herein.

What is claimed is:

1. A method of processing a substrate on a ceramic substrate heater in a process chamber, the method comprising:
forming a sacrificial protective coating on the ceramic substrate heater in the process chamber prior to placing a substrate on the substrate heater, including:
   (a) exposing the ceramic substrate heater to a metal-containing gas to deposit a first layer of the metal on the ceramic substrate heater, and
   (b) exposing the ceramic substrate heater to at least one non-metal-containing gas to deposit the at least one non-metal on the first metal layer,
wherein the sacrificial protective coating comprises a non-metal layer surface portion for receiving a substrate, and wherein the non-metal layer surface portion includes a first surface portion for receiving a substrate and a second surface portion that remains exposed when the first surface portion receives a substrate;
   (c) placing the at least one substrate on the first surface portion of the non-metal layer surface portion and thereafter subjecting the substrate to a process during which additional metal is deposited on the second surface portion:
   (d) removing the processed substrate from the process chamber and again exposing the coated ceramic substrate heater to the at least one non-metal-containing gas to deposit additional non-metal to cover the additional metal;
   (e) repeating (c) and (d) until a desired number of substrates have been processed; and
   (f) stripping the sacrificial protective coating and additional metal and non-metal deposits from the ceramic substrate heater.

2. The method according to claim 1, wherein the non-metal layer surface portion is silicon or graphite.

3. The method according to claim 1, wherein the ceramic substrate heater comprises at least one ceramic selected from the group consisting of AlN, $Al_2O_3$, SiC, and BeO.

4. The method according to claim 1, wherein the metal of the sacrificial protective coating comprises Re, Ru, Ta, Ni, or Cr or a combination of two or more thereof.

5. The method according to claim 1, wherein the metal-containing gas comprises at least one metal-carbonyl gas selected from the group consisting of $Ru_3(CO)_{12}$, $Ni(CO)_4$, $Co_2(CO)_8$, $Rh_4(CO)_{12}$, $Re_2(CO)_{10}$, and $Cr(CO)_6$.

6. The method according to claim 1, wherein the non-metal-containing gas comprises a silicon-containing gas, a hydrocarbon gas, an oxygen-containing gas, or a nitrogen-containing gas or a combination of two or more thereof.

7. The method according to claim 1, wherein the non-metal-containing gas comprises $SiH_4$, $Si_2H_6$, $SiCl_2H_2$, $Si_2Cl_6$, an alkane, an alkene, an alkyne, $O_2$, $O_3$, $CO_2$, CO, $N_2$, NO, $NO_2$, or $N_2O$ or a combination of two or more thereof.

8. The method according to claim 1, wherein the forming further comprises heating the substrate heater to between about 100° C. and about 800° C.

9. The method according to claim 1, wherein the forming further comprises heating the ceramic substrate heater to between about 300° C. and about 600° C.

10. The method according to claim 1, wherein the non-metal layer comprises Si.

11. The method according to claim 1, wherein the process during which additional metal is deposited on the second surface portion is selected from the group consisting of a TCVD process, an ALD process, a PECVD process, and an etching process.

12. The method according to claim 1 wherein the sacrificial protective coating substantially covers the exposed surfaces of the ceramic substrate heater.

13. The method according to claim 1, further comprising repeating (a) through (f) at least once.

14. A method of processing a substrate on a ceramic substrate heater in a process chamber, the method comprising:
forming a Si/Ru protective coating on the ceramic substrate heater in the process chamber prior to placing a substrate on the substrate heater, including:
   exposing the ceramic substrate heater to $Ru_3(CO)_{12}$ to deposit a Ru layer on the ceramic substrate heater, and
   thereafter, exposing the ceramic substrate heater to $SiH_4$ to deposit a Si layer on the Ru layer; and
processing at least one substrate on the coated ceramic substrate heater, including:
   providing a substrate to be processed on the coated ceramic substrate heater,
   performing a Ru deposition process on the substrate by exposing the substrate to $Ru_3(CO)_{12}$; and
   removing the processed substrate from the process chamber.

15. The method according to claim 14, further comprising forming a Si layer on the protective coating following the removing, and repeating the processing at least once.

16. A method of processing a substrate on a ceramic substrate heater in a process chamber, the method comprising:
forming a protective coating on the ceramic substrate heater in the process chamber prior to placing a substrate on the substrate heater, including:
   (a) exposing the ceramic substrate heater to a metal-containing gas to deposit the metal, wherein the metal-containing gas comprises a Ru-containing gas, and
   (b) exposing the ceramic substrate heater to at least one non-metal-containing gas to deposit the at least one non-metal, wherein the non-metal-containing gas comprises a silicon-containing gas,
wherein the protective coating comprises a surface portion for receiving a substrate, and wherein the surface portion is a non-metal layer and
processing at least one substrate on the coated ceramic substrate heater.

17. The method according to claim 16, wherein the metal-containing gas comprises $Ru_3(CO)_{12}$ and the non-metal-containing gas comprises $SiH_4$.

18. The method according to claim 16 further including:
removing the at least one substrate and stripping the protective coating from the ceramic substrate heater.

* * * * *